United States Patent [19]

Bandzuch et al.

[11] Patent Number: 5,525,812
[45] Date of Patent: Jun. 11, 1996

[54] RETRACTABLE PIN DUAL IN-LINE PACKAGE TEST CLIP

[75] Inventors: Gregory S. Bandzuch, Washington; William J. Kosslow, Jefferson Boro, both of Pa.

[73] Assignee: The United States of America as represented by the United States Department of Energy, Washington, D.C.

[21] Appl. No.: 162,828

[22] Filed: Dec. 7, 1993

[51] Int. Cl.[6] ................................................ H01L 23/58
[52] U.S. Cl. .......................... 257/48; 257/678; 29/749; 29/758; 422/56
[58] Field of Search .................... 257/678, 48, 697, 257/726; 422/56; 29/749, 757, 758, 761

[56] References Cited

U.S. PATENT DOCUMENTS

| | | | |
|---|---|---|---|
| Re. 28,064 | 7/1974 | Venaleck et al. | 339/174 |
| 3,506,949 | 4/1970 | Venaleck et al. | 339/174 |
| 3,551,878 | 12/1970 | Rossman | 339/75 |
| 3,678,442 | 7/1972 | Cope | 339/111 |
| 3,899,239 | 8/1975 | Allard | 339/255 P |
| 3,914,007 | 10/1975 | Seidler | 339/255 P |
| 4,414,506 | 11/1983 | Kelley | 324/158 P |
| 4,543,624 | 9/1985 | Rumble | 363/146 |
| 4,618,208 | 10/1986 | Igarashi | 339/200 P |
| 4,749,362 | 6/1988 | Hoffman et al. | 439/269 |
| 4,777,445 | 10/1988 | Kahl | 324/538 |
| 4,981,441 | 1/1991 | Ignasiak | 439/269 |
| 5,124,646 | 6/1992 | Shiraishi | 324/158 P |

*Primary Examiner*—William Mintel
*Assistant Examiner*—Roy Potter
*Attorney, Agent, or Firm*—Virginia B. Caress; William R. Moser; Paul A. Gottlieb

[57] ABSTRACT

This invention is a Dual In-Line Package (DIP) test clip for use when troubleshooting circuits containing DIP integrated circuits. This test clip is a significant improvement over existing DIP test clips in that it has retractable pins which will permit troubleshooting without risk of accidentally shorting adjacent pins together when moving probes to different pins on energized circuits or when the probe is accidentally bumped while taking measurements.

12 Claims, 2 Drawing Sheets

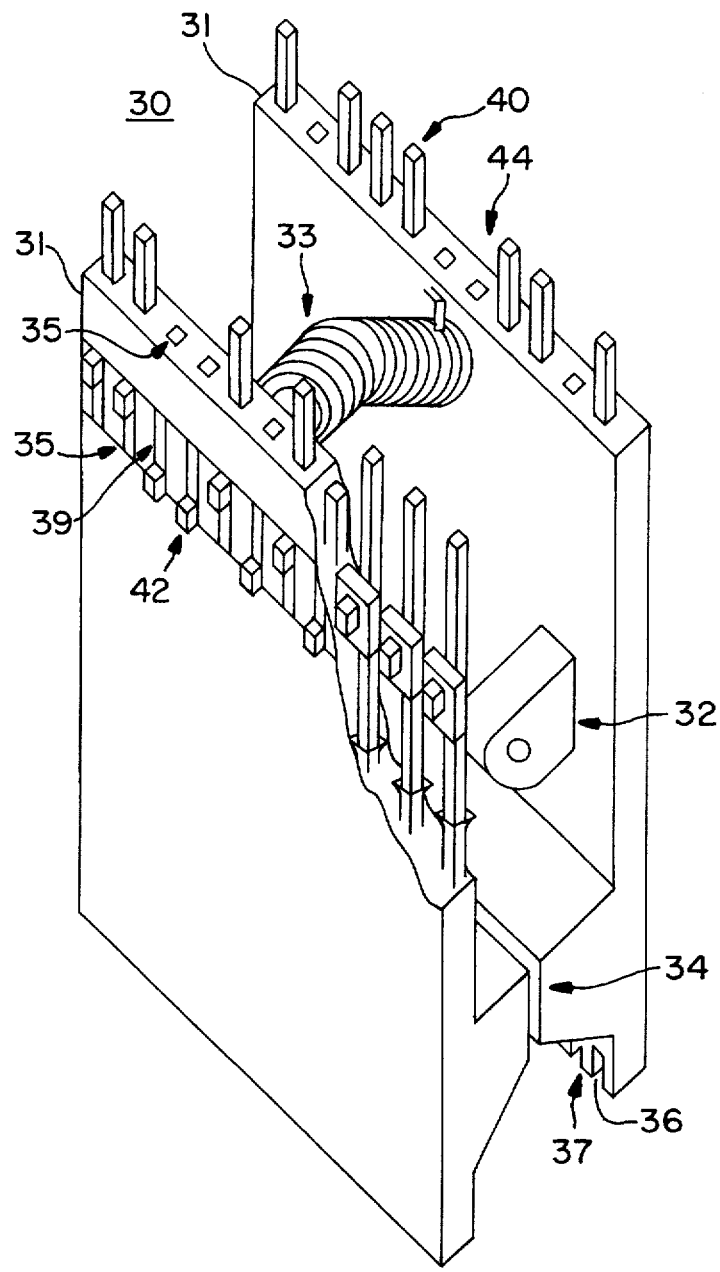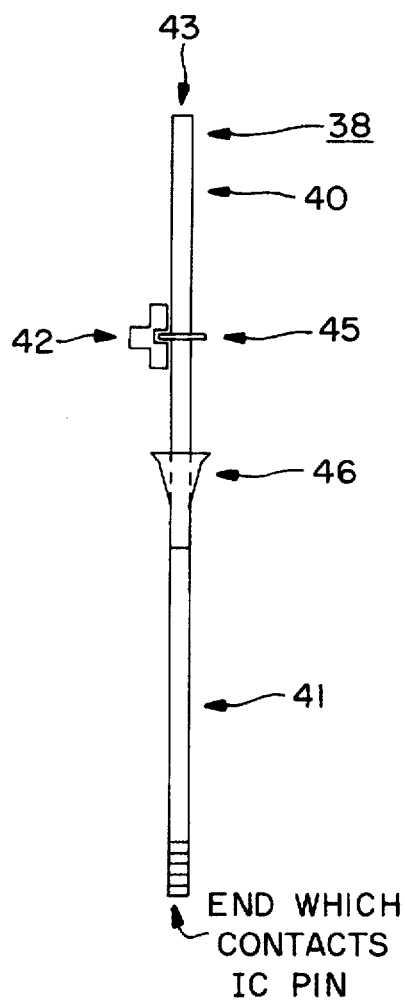
FIG. 2A
FIG. 2B

RETRACTABLE PIN DUAL IN-LINE PACKAGE TEST CLIP

BACKGROUND OF THE INVENTION

The dual in-line package (DIP) is the standard carrier for integrated circuits (IC's) in current electronic circuit practice. The DIP comprises a rigid housing, generally of insulating plastic, which surrounds the IC and protects it from mechanical, chemical, and electrical hazards, and a set of leads or pins which are connected electrically to contacts on the IC chip before the package is sealed and which function externally to connect the package electrically and mechanically to balance-of-circuit components. IC's come in one of several standard regular sizes with relatively standardized numbers of connector pins, e.g., 8, 12, 16, 24, 32. For a given configuration, the pin size and the spacing between pins is also standardized.

In normal practice, DIP IC's are installed onto printed circuit boards to form an electronic assembly in one of two ways: 1) the DIP IC connector pins are inserted into holes proformed in or drilled through a printed circuit board and the DIP IC pins are hard-soldered to metal tracks on the printed circuit board, thus making electrical connection and providing a mechanically secure installation; or 2) a socket is soldered onto the printed circuit board and the DIP IC leads are inserted into the socket and are retained by friction. This arrangement permits easy replacement of the IC. In either method of installation, portions of the DIP leads along the sides of the housing are electrically exposed, allowing for external electrical contact for such purposes as testing and troubleshooting.

There is frequent call for troubleshooting of electronic circuit boards carrying DIP IC's. Swapping a suspected bad DIP IC is a well known way to check functioning of an individual component. Swapping, however, is not physically feasible if the DIP is hard soldered to the circuit board. For socket mounted DIP IC's, on the other hand, swapping is not economically feasible except when the number of different IC's in use is very limited. In most instances, the number of different spare IC's which would have to be kept on-hand to implement swapping as a standard troubleshooting strategy would necessitate maintenance of a prohibitively large and expensive inventory of spare chips.

The preferred method of troubleshooting is electronic measurement at various points in a circuit. By measuring the inputs and outputs of a DIP IC, a technician can determine if its performance is satisfactory. The technician therefore must be able to make signal and voltage measurements on specific leads of individual components. Performing measurements on individual DIP IC pins is often required to isolate trouble in a circuit to a particular section of a circuit board or a specific chip and is indispensable for diagnosing faults in individual IC's.

The simplest and most common currently available device for electrical access to the pins on a DIP IC is the prior art DIP test clip shown in FIG. 1. The standard DIP test clip now in use is mechanically analogous to a simple alligator clip.

In use, the test clip is placed over a DIP IC which is attached to a circuit board. One end of the test clip, fitted with contact surfaces separated from one another by insulation to avoid shorting, makes contact with the IC leads. The other end has pin extensions which provide access for connecting test probes to the extensions of the pins protruding out the top of the test clip. The clip is held in place by spring pressure.

An inherent problem with the standard test clip of this type is that the very small typical separation of adjacent test pin ends (0.065 inches) protruding from the top of the test clip, as shown in FIG. 1, creates a significant risk of accidental shorting of adjacent pins. There are several types of test probes currently in use for performing measurements on energized circuits which are typically used in conjunction with DIP test clips. The most common are (1) the minigrabber, (2) the minigator clip, (3) the oscilloscope probe. The minigrabber has a typical contact width of 0.09 in., the minigator clip has a typical nose width of 0.13 in., and the oscilloscope probe has a typical contact width of 0.09 in., all significantly larger than the standard separation of the pins in a test clip. In addition, the minigator clip can short to the adjacent pin even after it has been securely connected to the test clip pin if the probe wire attached to it is accidentally moved.

If adjacent pins are shorted the IC will often be destroyed, preventing further troubleshooting efforts until a replacement IC can be obtained and inserted. Thus, for all of the test probes used in conjunction with present DIP test clips, the circuit under investigation must be deenergized each time a new test point is to be measured and great care must be taken so that accidental movement of the test leads does not result in shorting to adjacent pins. The deenergization of circuitry while moving test probes even in low voltage circuits is presently considered good troubleshooting practice because of the high likelihood of shorting.

During normal troubleshooting activities for DIP IC's, however, only a few pins on a particular IC are really of interest to the technician. The key limitation of the current test clip is the presence of pins not of interest, creating the likelihood of shorting and the need to deenergize circuits between tests. Thus there is need for an improvement which eliminates much of the risk of shorting and the concomitant inconvenience and time loss due to the need to deenergize the circuit to move a probe during testing or troubleshooting. The current invention satisfies this need.

SUMMARY OF THE INVENTION

This invention is a low cost improvement to existing DIP test clips. In this improvement the protruding pin ends for attachment of test probes are retractable. The retractable pin DIP test clip of this invention makes it possible to expose fully only those pins of interest and to retract all others to a safe position in which test probes cannot come in contact with them. Limitation of the number of exposed pins allows relatively unrestricted movement of test probes on energized circuits and minimizes concern with accidentally bumping a connected probe and shorting out pins. It also improves troubleshooting because only the pins of interest are fully extended, preventing connection to incorrect pins.

BRIEF DESCRIPTION OF THE DRAWINGS

FIG. 2 exhibits the operation of the retractable pins and retractable pin test clip of this invention and the construction of the retractable pin itself.

DETAILED DESCRIPTION OF THE PREFERRED EMBODIMENT

Figure 1A:
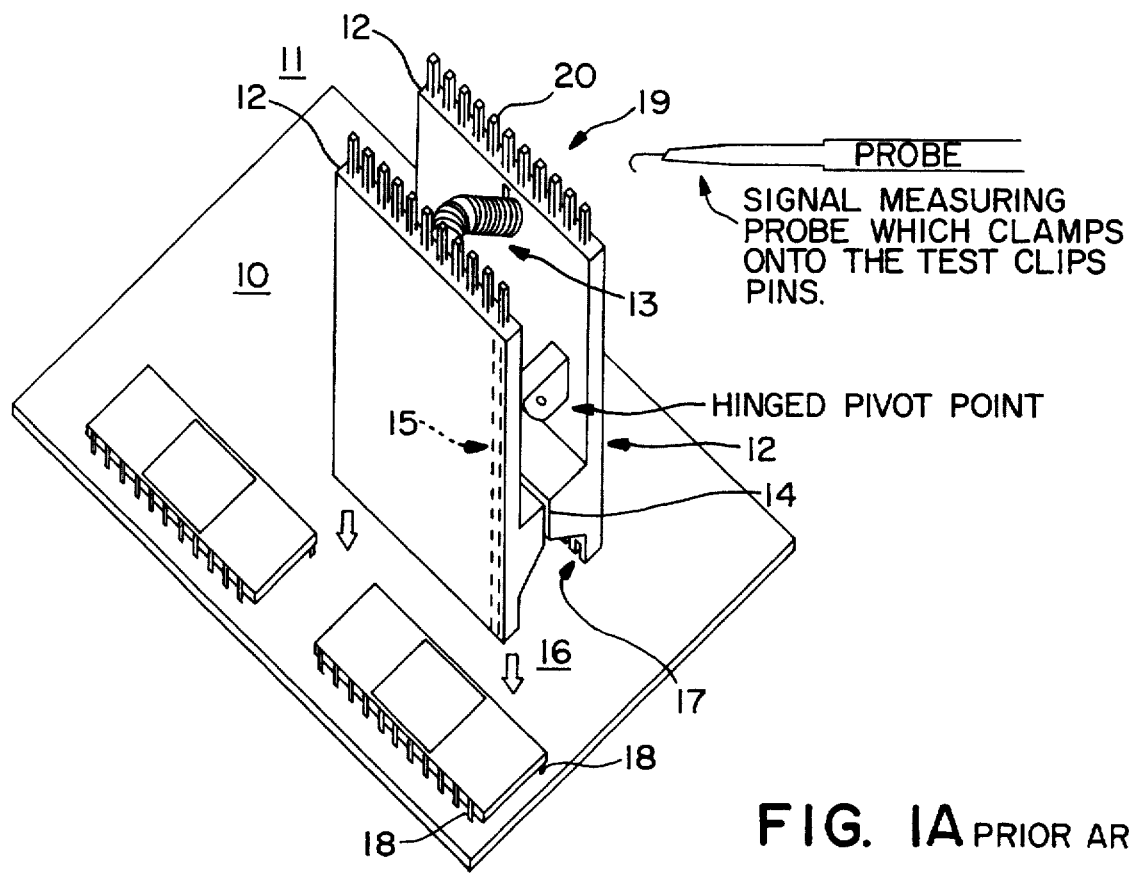
FIG. 1 shows the prior art dual in-line package test clip in relation to a DIP integrated circuit and a test probe as well as the dimensions of the clip and the dimensions and locations of the exposed test pins.

The retractable pin test clip of this invention comprises an inexpensive and rugged insulating plastic housing carrying pins which at the clip end are configured to make contact with the exposed leads of a DIP IC and at the opposite end can be exposed or retracted as needed to allow a probe to contact them to make specific measurements on specific leads of the DIP IC. The basic configuration of the housing is almost the same as the prior art housing, with two rectangular half clip housings hinged together, each half clip housing having a transverse boss on the inner face which makes contact with the boss on the other half clip housing to keep the ends of the clip at a predetermined spacing when the bosses are in contact. As in the prior art, the two half clip housings are driven together by a precompressed spring between the two halves on the opposite side of the hinges from the bosses. The mechanical arrangement provides an opening and closing function.

In this invention, however, the test clip pins at the end of the clip used to attach test probes are mechanically retractable (and alternately extendable) so that the portion of the pin available for test connection can either be extended for testing or completely retracted so as to be out of the way. Each such retractable pin comprises a hollow pin body having at one end means to make contact with an IC lead and at the other end means for accepting and making reliable electrical contact with a solid pin slider insert, and a solid pin slider insert slidably inserted into the hollow pin body through the means for making reliable electrical contact. Typically, though not necessarily, the means for making reliable electrical contact with the solid pin slider insert is a tulip-type connector, shown schematically in FIG. 2. The pin slider insert also contains means, in this embodiment a handle making mechanical contact with a flat annular disk around the pin slider insert, to move the pin slider insert in an axial direction into or out of the hollow pin body. The solid pin slider inserts can be fully extended for connecting to test probes or fully retracted into the plastic case in a safe position to avoid any possibility of making unwanted electrical contact with extraneous objects.

This invention can be more fully understood with reference to FIGS. 1 and 2. As shown in FIG. 1, the prior art DIP test clip 10 comprises an insulating housing 11 itself comprising two rigid insulating half clip housings 12 of generally rectangular shape. The assembled housing of the prior art test clip has a compressed spring 13 transverse between the two half clip housings and configured to drive the test probe pin ends of the half clip housings apart and the IC contact ends of the half clip housings toward one another when the spring is expanded. Two parallel rectangular transverse bosses 14 on the inside faces of the two half clip housings serve to keep the half clip housings approximately parallel when the spring is not externally compressed.

Each half clip housing of the prior art test clip contains in longitudinal hollow channels a plurality of solid rigidly fixed parallel conductors 15 such that at the IC contact end 16 serrated openings in the insulation 17 allow electrical contact of each test clip conductor 15 with the corresponding IC lead 18 with insulation in between. The separation of the half clip housings when the spring is compressed is such as to more than encompass the width of the DIP IC to be tested. When the spring is released after attachment to the IC, its force presses the test clip contacts firmly against the IC leads, thereby assuring good electrical contact. At the other end of each half clip housing 19, the conductors protrude from the insulator in the form of pins 20 to which test probes can be attached.

As in the prior art DIP IC test clip, the plastic housing of this invention 30, as shown in FIG. 2, comprises two generally rectangular insulating half clip housing elements 31 which are hinged near their center 32 and are mechanically pressed together at the opposing end by the pressure of a precompressed spring 33. In the current invention as with the prior art test clip, the spring 33 holds the clip normally in the closed position. The half clip housings 31 have raised rectangular transverse bosses 34 in mirror image locations, the function of which is to keep the two half clip housings approximately parallel and a predetermined distance apart when the clip contact end is not expanded mechanically.

In the current invention, as in the prior art clip, each half clip housing has longitudinal hollow channels 35 through which pass conducting pins having contact areas 36 which can make electrical contact with the leads of the IC to be tested. The principal improvement in the half clip housing of this invention is that it has narrow slots 39 from the outside surface of the half clip housing into the longitudinal hollow channels 35. The half clip housings are configured so that the insulating material of the element insulates at the partially open end 37 between the points where the clip connects with the IC contacts 36, thereby giving the portion of that end of the half clip housing which is to contact the IC leads a serrated form.

The current invention, instead of having rigid solid pins throughout the length of the half clip housing, however, has adjustable length pins 38 which have means, accessible through narrow slots 39 opened in the exterior side of each half clip housing, for extending and retracting the pin slider insert. The adjustable length pin 38 shown in FIG. 2 comprises a pin slider insert 40 which is a solid conductor of arbitrary cross sectional shape and thin in relation to its long dimension, a hollow pin body 41 of the same cross sectional shape as the pin slider insert and having inside dimensions just enough larger than those of the pin slider insert to allow the pin slider insert to slide into and out of the pin body while maintaining electrical contact, and a means for extending and retracting the pin slider insert, preferably a slide handle 42. The pin slider inserts are typically solid to minimize bending. Tops of the pin slider inserts are normally insulated 43 to eliminate all possibility of accidental shorting to retracted pins 44.

Each pin slider insert has a flat annular disk portion 45 which mates with the slide handle 42 to make the pin extend or retract when the handle is moved. The slide handle 42, which allows the pin slider insert 40 to be slid easily into and out of the plastic housing, fits over the disk portion 45 of the pin slider insert and has cut outs on its sides of the same shape as the narrow portion of the pin slider insert to facilitate mating. Each half clip housing 31 has slots 39 opening into the channel in the half clip housing which contains the retractable pin, so that a portion of the slide handle protrudes through the exterior surface of the half clip housing in such a way that a technician can slide the handle up and down, thereby retracting the pin slider insert into or extending it out of the half clip housing.

The hollow pin body 41 makes mechanical and electrical contact with the pin slider 40 via a four section tulip type connection 46. The hollow pin body 41 extends through the plastic case to the bottom of the test clip 36 where it is exposed between insulating serrations of the housing 37 so that it can make contact with the pins on an IC chip. When the slide handle 42 is manipulated, the pin slider insert 40 slides into and out of the hollow pin body 41, with the tulip-type connection 46 maintaining continuous electrical contact.

As a result of the foregoing configuration, the technician can attach the test clip to a DIP IC, exposing precisely those pins necessary to make a particular measurement and only those pins. The technician can then move the test probe lead between test points and pins can be exposed or retracted while the IC chip is energized without the possibility of accidentally shorting between adjacent pins with the test probe lead. Further, only the pins of interest are exposed at the time of measurement, eliminating the chance of measuring the signal on the wrong DIP test clip pin.

We claim:

1. A dual in-line package integrated circuit test clip provided with conducting test pins, wherein said test pins are retractable test pins comprised of two parts in continuous mechanical contact with each other, said test clip adapted to expose only those test pins of interest and retract other said test pins into a clip housing.

2. The dual in-line package integrated circuit test clip of claim 1, wherein said retractable test pins are adjustable length test pins.

3. A dual in-line package integrated circuit test clip comprising an insulating clip housing comprising two insulating half clip housings hinged together and held in the normally closed position by an opposing compressed spring, said half clip housings having interior channels to accommodate retractable test pins, said interior channels having slots communicating with the exterior surface of the half clip housing, whereby means for moving said retractable test pins is accessed; and retractable test pins comprising a pin slider insert having means for moving the pin slider insert along an axial direction;

a hollow pin body into which the pin slider insert fits slidably, said hollow pin body having at one end means for making contact with an IC lead and at the other end means for providing continuous electrical contact with the pin slider insert.

4. The dual in-line package integrated circuit test clip of claim 3 wherein the means for moving the pin slider insert comprises an annular flat coaxial disk attached to the pin slider insert and a pin handle disposed around said disk so as to move said pin slider insert in an axial direction.

5. The dual in-line package integrated circuit test clip of claim 3 wherein the exterior end of the pin slider insert has an insulated top portion.

6. A dual in-line package integrated circuit test clip comprising:

an insulating housing comprising:

two insulating half clip housings comprising rectangular solids, each having an external surface and an internal surface, and each having on its internal surface hinge means whereby the two half clip housings are hinged together and a transverse rectangular boss such that the two bosses function to separate the two half clip housings when the two half clip housings are assembled into the housing and in a fully closed position;

a plurality of longitudinal interior through channels of a size to accommodate retractable test pins;

on its external surface a plurality of rectangular slots communicating with said longitudinal interior through channels whereby access to means for moving retractable pins is provided; and serrated openings at the integrated circuit lead end of the half clip housings configured in such a way as to insulate between the contact ends of the hollow pin bodies while exposing one side of the pins to make contact with dual in-line package integrated circuit leads; and a spring means disposed between the two half clip housings whereby the clip housing is maintained in a closed position when no external force is applied; and a plurality of retractable pins, each comprising:

a pin slider insert comprising a solid conducting pin and having an annular flat coaxial disk affixed thereto;

a slide handle comprising a handle end and an open end, the sides of said open end having cutouts which fit the shape of said pin slider insert, the sides of said open end fitting over said annular flat coaxial disk;

a hollow pin body comprising a thin hollow conducting cylinder the inside diameter of which is large enough to permit the pin slider insert to slide into and out of the hollow pin body, said thin hollow conducting cylinder having a contact end and a connection end, said contact end being configured so as to make electrical contact with an integrated circuit lead, and said connection end having attached to it a means for assuring continuous electrical contact between the hollow pin body and the pin slider insert sliding inside it.

7. The dual in-line package integrated circuit test clip of claim 6 wherein the pin slider inserts additionally comprise an insulated top portion on the exterior end of the pin slider insert.

8. The dual in-line package integrated circuit test clip of claim 6 wherein the means for assuring continuous electrical contact between the hollow pin body and the pin slider insert sliding inside it is a tulip type connector.

9. A retractable test pin for a dual in-line package integrated circuit test clip comprising:

a pin slider insert comprising a solid conducting pin having an annular flat coaxial disk whereby the pin slider insert is moved in an axial direction;

a slide handle comprising a handle end and an open end, the sides of said open end having substantially circular cutouts which fit the cross sectional shape of said pin slider insert, the sides of said open end fitting over said annular flat coaxial disk;

a hollow pin body into which the pin slider insert fits, the inside shape and size of which to permit the pin slider insert to slide into and out of the hollow pin body, said hollow pin body having a contact end and a connection end, said contact end being configured so as effectively to make electrical contact with an integrated circuit lead, and said connection end having means for assuring continuous electrical contact between the hollow pin body and the pin slider insert when the pin slider insert is slid inside it.

10. The retractable test pin of claim 9 in which the pin slider insert has an exposed end and a connection end, the exposed end having insulation at its tip, whereby avoidance of shorting is assured when the pin is retracted.

11. The retractable test pin of claim 9 in which the means for assuring continuous electrical contact between the hollow pin body and the pin slider insert is a tulip type connector.

12. A dual in-line package integrated circuit test clip comprising an insulating clip housing having interior channels to accommodate retractable test pins, and a plurality of retractable test pins, said pins being comprised of a hollow pin body and a solid pin slider insert, said pin slider insert having means for moving each pin slider insert individually in an axial direction into and out of said hollow pin body while maintaining continuous electrical contact.

* * * * *

UNITED STATES PATENT AND TRADEMARK OFFICE
CERTIFICATE OF CORRECTION

Figure 1B:
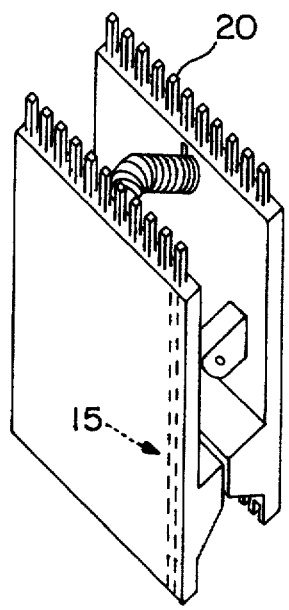

PATENT NO. : 5,525,812
DATED : June 11, 1996
INVENTOR(S) : Gregory S. Bandzuch and William J. Kosslow It is certified that error appears in the above-indentified patent and that said Letters Patent is hereby corrected as shown below:

Column 2, line 56, change "FIG. 1" to -- FIG. 1A --.
        line 57-58, delete "as well as", and insert therefor --, and FIG. 1B shows --.
        line 58, before the word "clip" insert -- prior art --.
        line 60, change "FIG. 2" to -- FIG. 2A --.
        line 61, after the words "invention and" insert -- FIG. 2B depicts --.

Column 3,
        line 66, change "FIG. 2" to -- FIG. 2A --.

Column 4, line 28, change "FIG. 2" to -- FIG. 2B --.
        line 47, correct the spelling of "cut outs" to -- cutouts --.

Signed and Sealed this

Tenth Day of December, 1996

Attest:

BRUCE LEHMAN

Attesting Officer      Commissioner of Patents and Trademarks